United States Patent
Aluru et al.

(10) Patent No.: US 9,495,486 B1
(45) Date of Patent: Nov. 15, 2016

(54) METHODS AND APPARATUS FOR SAN ENVIRONMENT SIMULATION

(71) Applicant: EMC Corporation, Hopkinton, MA (US)

(72) Inventors: Anand Aluru, Bangalore (IN); Dhaneesh Kumar Nettukandy Kollakote, Bangalore (IN); Gnana A. Berina, Bangalore (IN); Sandeep Bhasin, Bangalore (IN); Vasantha Gopal Thirupugal Samy, Madurai (IN); Robert E. Tillman, Milford, MA (US); Karthikeyan Neethi, Chennai (IN); Rijoy Ravindran, Bangalore (IN); Soma Sankara Rao Kadam Munichandra, Bangalore (IN); Prabakaran Kuppusamy, Karur (IN); Pat McLaughlin, Medway, MA (US)

(73) Assignee: EMC CORPORATION, Hopkinton, MA (US)

( * ) Notice: Subject to any disclaimer, the term of this patent is extended or adjusted under 35 U.S.C. 154(b) by 585 days.

(21) Appl. No.: 13/730,091

(22) Filed: Dec. 28, 2012

(51) Int. Cl.
G06F 9/44 (2006.01)
G06F 17/50 (2006.01)

(52) U.S. Cl.
CPC .................. G06F 17/5009 (2013.01)

(58) Field of Classification Search
CPC ............. H04L 41/046; H04L 41/145; H04L 67/1097; H04L 63/10; H04L 49/356; H04L 49/70; H04L 49/35; G06F 17/30867; G06F 3/067; G06F 3/0604; G06F 3/0665; G06F 3/0605; G06F 3/0637

USPC ............................................. 703/21
See application file for complete search history.

(56) References Cited

U.S. PATENT DOCUMENTS

| | | | | |
|---|---|---|---|---|
| 6,839,746 B1 * | 1/2005 | Muthiyan | ............... | H04L 29/06 709/220 |
| 7,194,538 B1 * | 3/2007 | Rabe et al. | .................. | 709/224 |
| 7,403,987 B1 * | 7/2008 | Marinelli et al. | ............. | 709/223 |
| 7,620,775 B1 * | 11/2009 | Waxman | ....................... | 711/114 |
| 7,711,978 B1 * | 5/2010 | Roy | ....................... | G06F 11/201 714/43 |
| 7,770,059 B1 * | 8/2010 | Glade et al. | ................. | 714/6.32 |
| 7,774,444 B1 * | 8/2010 | George | ................. | H04L 41/145 709/217 |
| 7,860,015 B1 * | 12/2010 | Panelli | ....................... | G06F 3/06 370/241 |
| 7,886,031 B1 * | 2/2011 | Taylor et al. | ................. | 709/221 |
| 8,024,169 B2 * | 9/2011 | Galgali et al. | .................. | 703/21 |
| 8,060,630 B1 * | 11/2011 | Jancaitis et al. | .............. | 709/229 |
| 8,090,908 B1 * | 1/2012 | Bolen et al. | .................. | 711/114 |

(Continued)

OTHER PUBLICATIONS

Roulray et al. ("iSAN: Storage Area Network Management Modeling Simulation", IEEE, 2007, pp. 1-8).*

*Primary Examiner* — Omar Fernandez Rivas
*Assistant Examiner* — Iftekhar Khan
(74) *Attorney, Agent, or Firm* — Daly, Crowley, Mofford & Durkee, LLP

(57) ABSTRACT

Methods and apparatus for providing simulation of a SAN environment. Input provided by a user is used for hosts and arrays for determining switch fabrics. Connectivity and zoning can be determined with assigned storage. Events can be triggered to simulate operations in the SAN environment.

15 Claims, 17 Drawing Sheets

(56) References Cited

U.S. PATENT DOCUMENTS

| | | | |
|---|---|---|---|
| 8,127,307 B1* | 2/2012 | Palekar | G06F 11/0727 719/318 |
| 8,838,793 B1* | 9/2014 | Thrasher et al. | 709/226 |
| 8,856,337 B2* | 10/2014 | Otani | G06F 15/173 709/226 |
| 2003/0208589 A1* | 11/2003 | Yamamoto | H04L 41/0853 709/224 |
| 2007/0061454 A1* | 3/2007 | Lee et al. | 709/225 |
| 2007/0073782 A1* | 3/2007 | Nakatani et al. | 707/200 |
| 2009/0271415 A1* | 10/2009 | Galgali | H04L 67/1097 |
| 2009/0276202 A1* | 11/2009 | Susarla | H04L 41/145 703/21 |
| 2010/0198972 A1* | 8/2010 | Umbehocker | 709/226 |
| 2012/0197624 A1* | 8/2012 | Hawargi | G06F 3/0604 703/21 |

\* cited by examiner

METHODS AND APPARATUS FOR SAN ENVIRONMENT SIMULATION

BACKGROUND

As is known in the art, data center environment sizes are currently exploding. As is also known, there is an expectation that products will scale to existing data center environments. As storage area network (SAN) size and complexity increase, the time and resources needed to configure and test such SAN networks increases significantly. It would be desirable to test large SAN configurations without the need to set up the SAN in a test environment.

SUMMARY

The present invention provides method and apparatus for SAN environment simulation that can be used by management applications and to simulate the discovery of SAN components, such as storage arrays, SAN switches, and virtual infrastructure. Exemplary embodiments of the simulator support discovery of data center devices using, for example, SMI-S, SNMP, SSH, WMI, WS-Man, XML API for NAS interfaces and vCenter API for VMware Infrastructure. The simulator can generate complex SAN environments by simulating discovery of devices using various protocols.

While exemplary embodiments of the invention are shown and described as having particular functions, configurations, components, protocols, etc., it is understood that embodiments of the invention are applicable to storage networks in general in which simulating and/or testing, such as before physical implementation, is desirable.

While certain vendor-specific terms and components may be shown and/or referred to herein, it is understood that such terms and components are used in a generic sense unless clearly specified to the contrary. For example, a reference to Brocade switches and Cisco switches indicates that these types of switches in general are supported, including these particular components.

In one embodiment, an inventive simulator creates simulation environments having 25,220 total hosts (Physical hosts 10,220 and virtual hosts 15,000), 560 SAN Switches with 54,400 ports and 260 Storage arrays with 1.2 million storage volumes. It is understood that more and fewer components can be used in other embodiments.

It is understood that a variety of features can be supported in various embodiments, such as:
SAN simulation with multiprotocol support
End-to-end connectivity from host to connectivity to storage
encapsulated SAN topology best practices to calculate required number of SAN switches based on the number of hosts and arrays requiring connectivity
simulate Brocade switches and Cisco switches including Access Gateway and NPV switches
simulate EMC arrays—Symmetrix, CLARiiON and V-MAX.
supports NAS unified arrays and gateway arrays including Celerra and VNX.
simulation of VMware infrastructure including VCenter, ESX, VMs, Datastore, VMDK, VMFS and RDM.
simulation of Windows hosts using WMI and WS-MAN
simulation of Unix hosts using SSH
supports different topologies, ranging from single switch fabric, two switch fabrics to large complex cascaded fabrics, MESH topology and Edge-Core-Edge fabrics, based on EMC recommended best practices, for example
simulation of redundant paths through multiple fabric support
supports host masking and mapping to simulated array LUNS
support different types of zoning including single HBA zoning, array based zoning and host based zoning
performance Data Collection (PDC) support:
Arrays and switches based on SMI-S
ESX and VMs through VCenter.
Unix Hosts and Windows hosts using SSH, WMI and WS-MAN
SMI-S based Indication support for arrays and switches.
Event support for simulated VMware hosts.
Dynamic capacity distribution—volumes are assigned in appropriate pools and the usage is generated dynamically.
Support for EMC Fully Automated Storage Tiering (FAST) feature.
Simple UI to generate complex SAN environment without the need of knowing SAN topology details.
can also be used by data center administrators to plan their SAN and storage environment by using a visual topology editor It will be readily appreciated that simulating a SAN environment before implementation provides a number of benefits including: products which scale well, reduced hardware costs by eliminating the need for labs for testing applications at scale, reduced need for sharing of large infrastructures, amount of time required to create/modify a simulated environment is a fraction of the time required to create/modify a physical environment, and reduced resources to maintain large testing environments.

In one aspect of the invention, a method of simulating a SAN environment comprises: receiving user input for a simulated SAN environment, obtaining information for hosts in the SAN environment, obtaining information for arrays in the SAN environment, and creating, using a computer processor, the SAN environment including for a fabric, creating a first one of the arrays, a first one of the hosts, and calculating switches for the fabric, determining connectivity for components in the SAN environment, determining storage for the SAN environment including LUN masking and mapping, determining zoning based upon the storage, and triggering events for the SAN environment.

The method can further include one or more of the following features: configuring storage pools from the storage, the events include a switch event and/or an array event, enforcing best practices for the SAN environment, determining a number of SAN switches based upon a number of hosts and arrays with connectivity, determining end-to-end connectivity from the host to the storage, determining zoning for the arrays, simulating a virtualization application for the SAN environment, simulating NAS storage, performing performance data collection for the simulated SAN environment, determining whether redundant path required through multiple fabrics, the hosts comprise WINDOWS and UNIX systems, minimizing points of failure in the SAN environment, and/or handling a failover for the SAN environment.

In another aspect of the invention, n article comprises: a computer readable medium containing non-transitory stored instructions that enable a machine to simulate a SAN environment by: receiving user input for a simulated SAN environment, obtaining information for hosts in the SAN environment, obtaining information for arrays in the SAN environment, and creating, using a computer processor, the SAN environment including: for a fabric, creating a first one of the arrays, a first one of the hosts, and calculating switches for the fabric, determining connectivity for components in the SAN environment, determining storage for the SAN environment including LUN masking and mapping, determining zoning based upon the storage, and triggering events for the SAN environment.

In a further aspect of the invention, a system to simulate a SAN environment comprises: at least one processor, at least one memory coupled to the at least one processor, the at least one processor and the at least one memory configured to simulate a SAN environment by: receiving user input for a simulated SAN environment, obtaining information for hosts in the SAN environment, obtaining information for arrays in the SAN environment, and creating, using a computer processor, the SAN environment including: for a fabric, creating a first one of the arrays, a first one of the hosts, and calculating switches for the fabric, determining connectivity for components in the SAN environment, determining storage for the SAN environment including LUN masking and mapping, determining zoning based upon the storage, and/or triggering events for the SAN environment.

BRIEF DESCRIPTION OF THE DRAWINGS

The foregoing features of this invention, as well as the invention itself may be more fully understood from the following description of the drawings in which.

DETAILED DESCRIPTION

Figure 1:
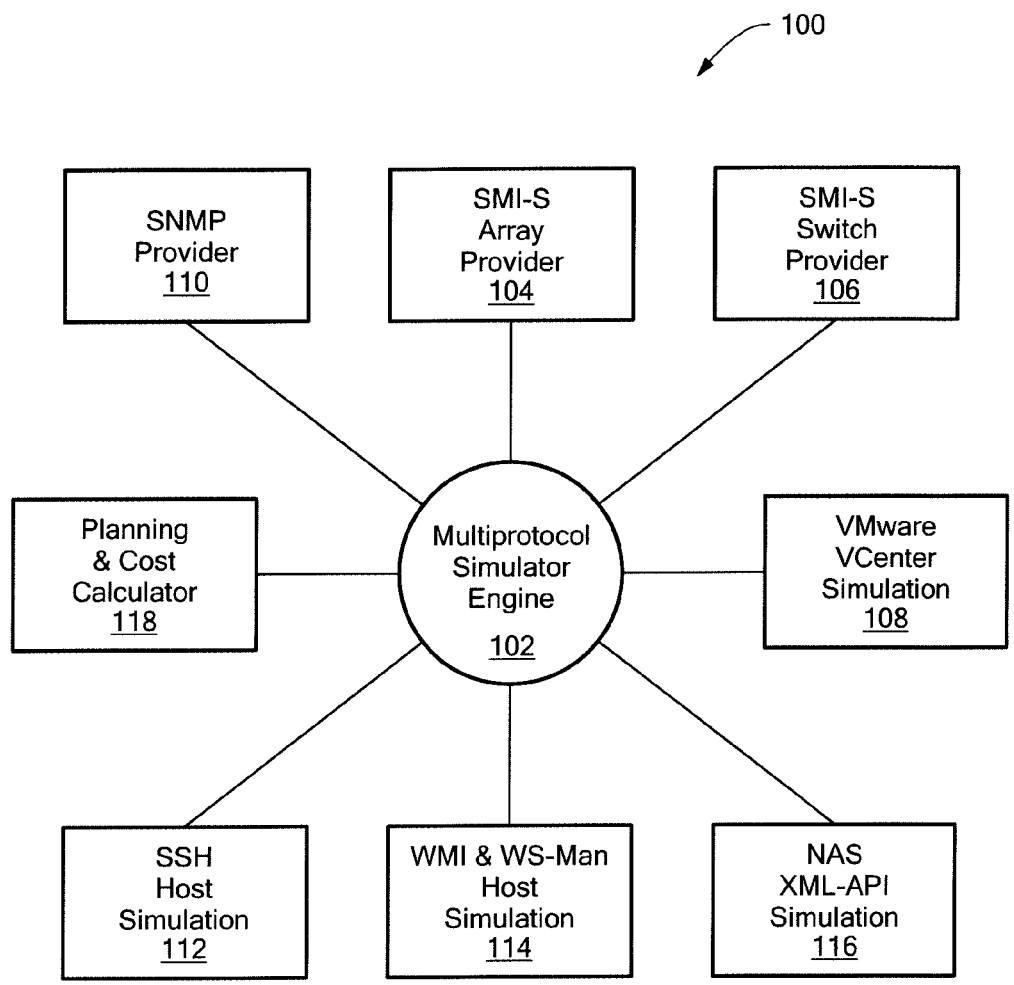
FIG. 1 is a high level block diagram of a simulated SAN environment in accordance with exemplary embodiments of the invention.

FIG. 1 shows an exemplary SAN simulator 100 in accordance with exemplary embodiments of the invention. A simulator engine 102 comprises an object model, such as a CIMOM object model, for SMIs to support arrays 104 and switches 106, virtualization infrastructure 108, e.g., VMware Infrastructure object model for supporting VCenter, ESX and VMs, and it contains APE (Active Probe Engine) object model for supporting Windows and UNIX hosts, SNMP providers 110, SSH hosts 112, WMI, WS-Man hosts 114, XML API for NAS interfaces 116, vCenter API for VMware Infrastructure and planning and cost center components 118 for calculating costs for setting up an actual data center.

Figure 2:
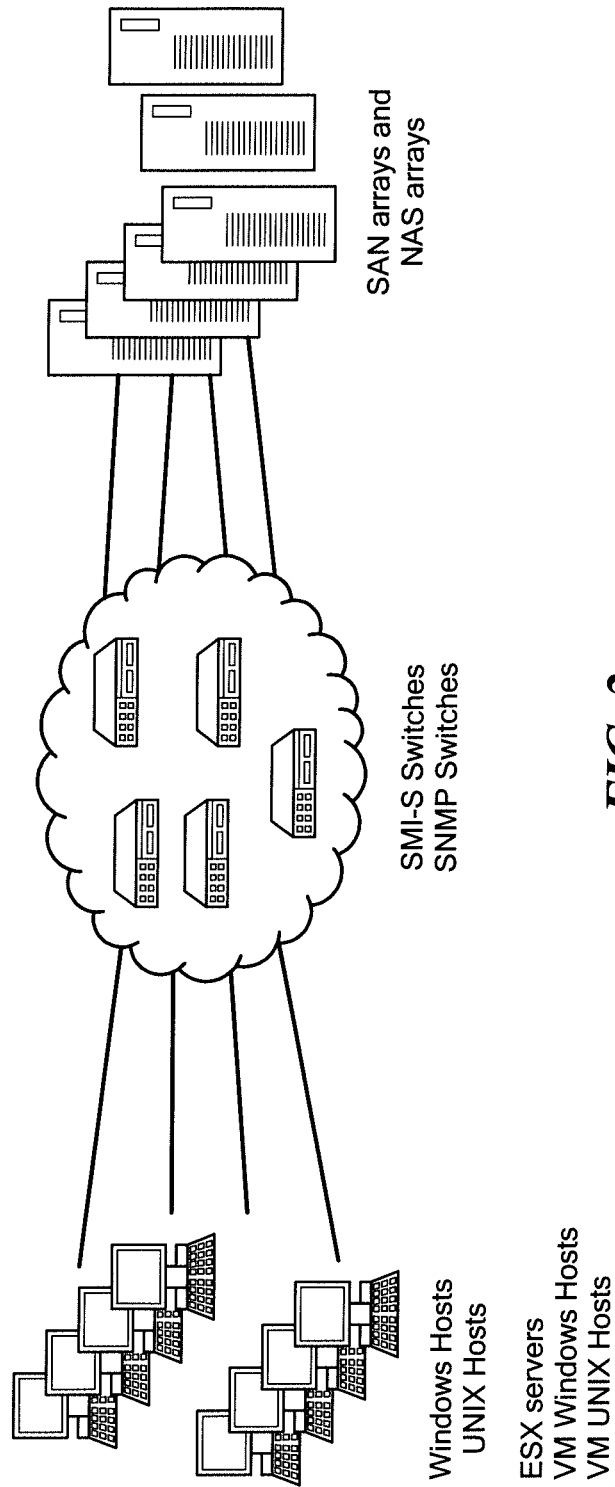
FIG. 2 is a schematic representation of an exemplary storage environment that can be simulated.

FIG. 2 shows an exemplary SAN that can be simulated including a series of switches to connect hosts and arrays. As noted above, the advantages of simulating a storage environment prior to actual implementation will be readily apparent to one of ordinary skill in the art.

Figure 2A:
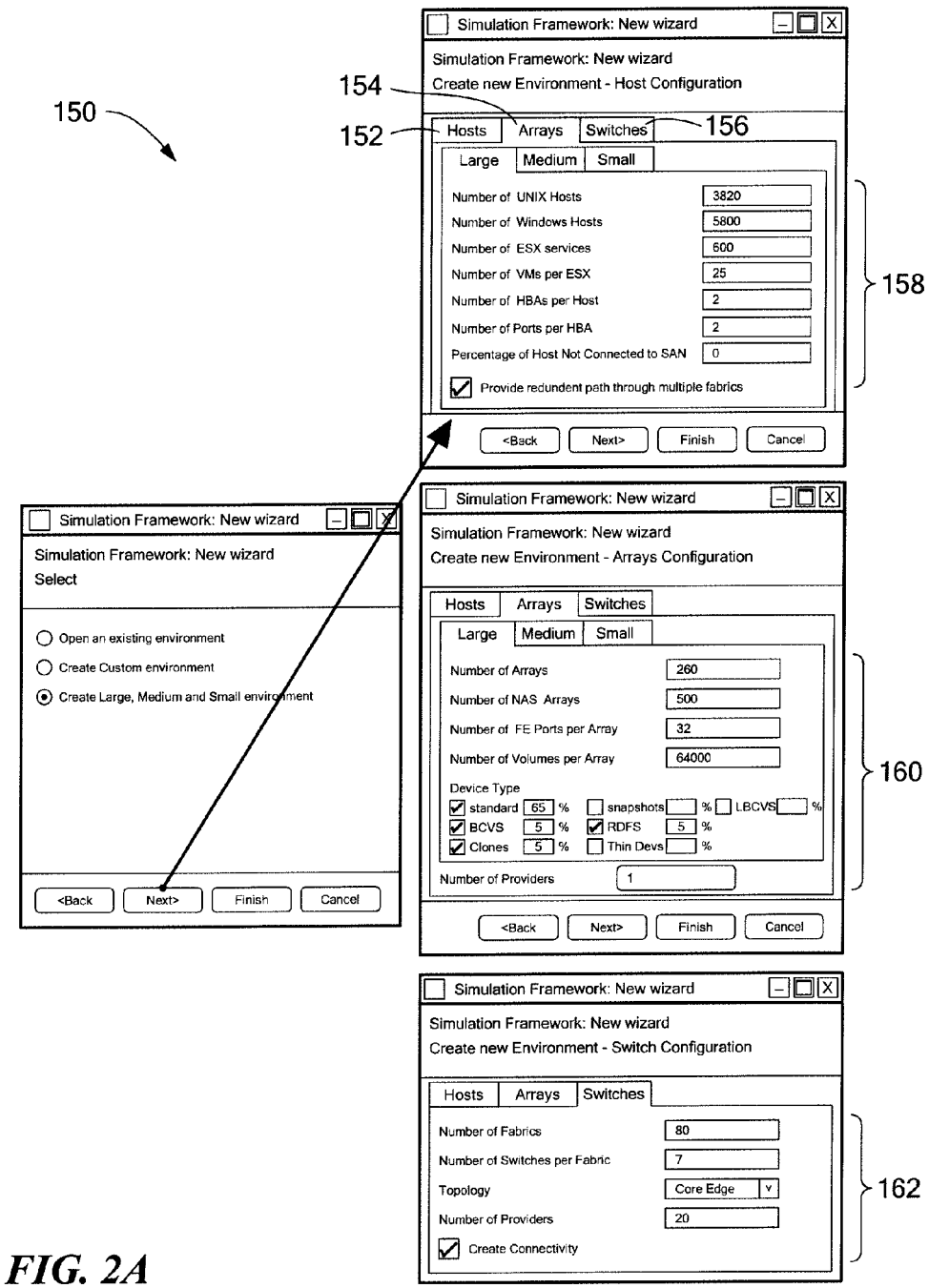
FIG. 2A shows an exemplary display screen to enable a user to create a simulation.
Figure 2B:
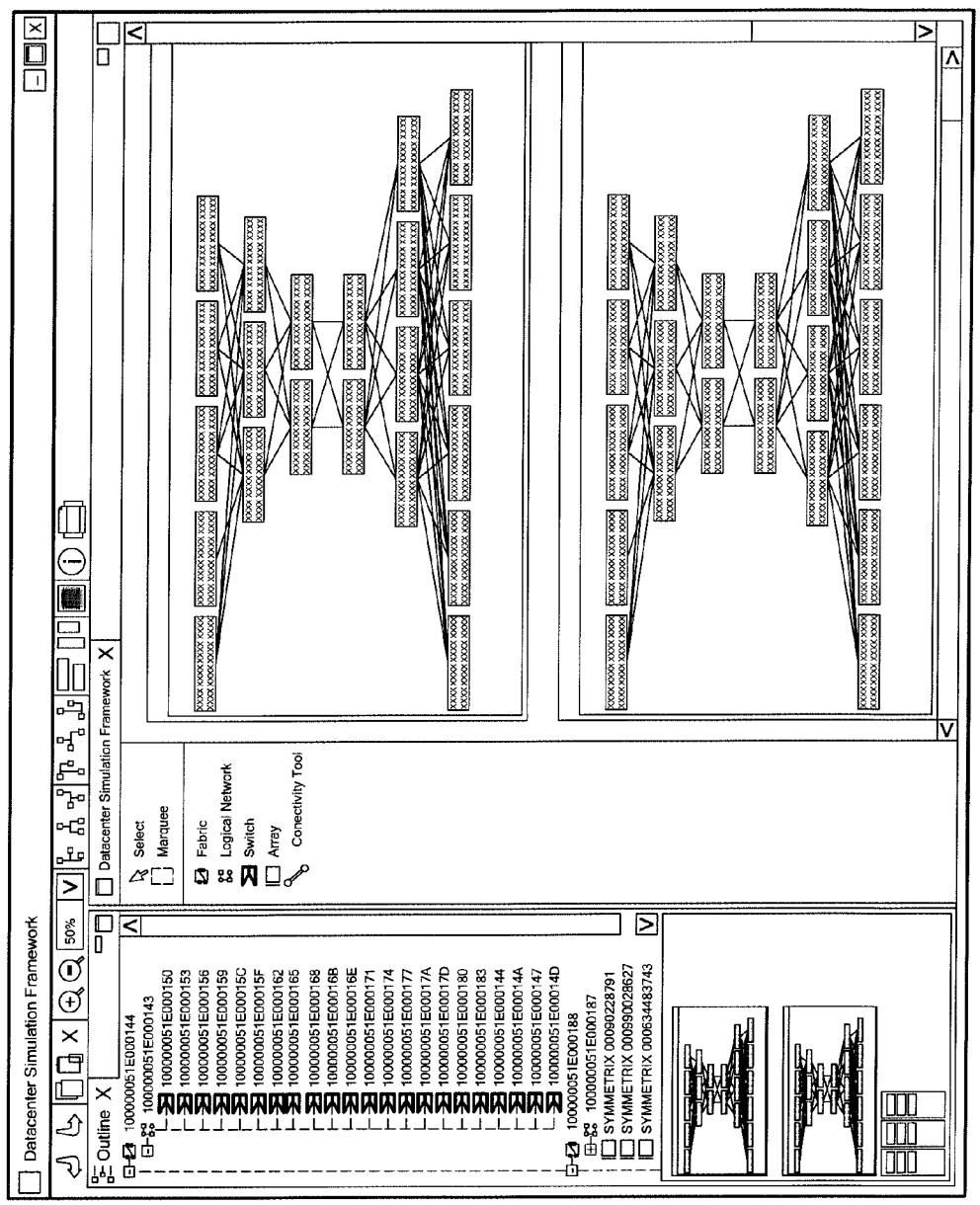
FIG. 2B shows a topology diagram for an exemplary created network.

FIG. 2A shows an exemplary GUI 150 where A user can input configuration details to create the data center environment. The GUI shows the topology representation for the created environment. Once the environment is created, the user can generate the XMLs and configuration files (generated artifacts). A user can enter information for hosts 152, arrays 154, and switches 156. Host information 158 can include number and type, e.g., Unix, WINDOWS, number of ESX servers, number of VMs per ESX, number of HBAs per host, number of ports, etc. Array configuration information 160 can include number and type of array, number of ports, number of volumes, and device types. Switch configuration information 162 can include number of fabrics, number of switches per fabric, topology, and number of providers. FIG. 2B shows an exemplary topology for the created network The engine 102 enables user to create large complex heterogeneous SAN environments by applying and confirming best practices. The user has the flexibility to create a required number of hosts, arrays and switches. For a host, the user can create the desired properties, such as number of ports in each HBA, operating system, number of devices visible to the hosts, etc. Related to arrays, the user can specify the model type like Symmetrix, CLARiiON and V-Max, for example, number of ports, number of volumes and total capacity of the array. According to the created topology, the connectivity can be displayed for the user.

Figure 3:
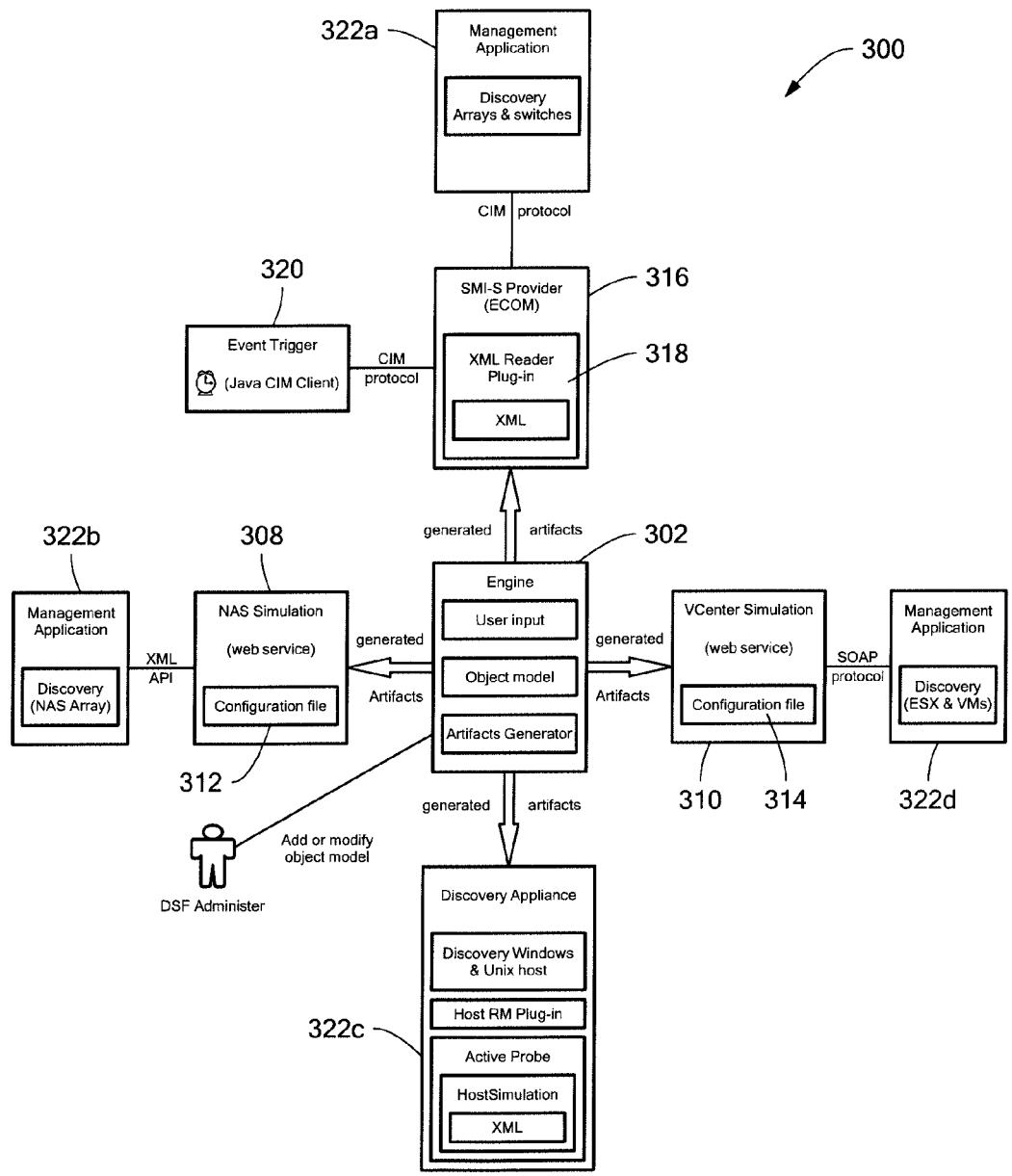
FIG. 3 is a schematic representation of components in a simulated SAN environment.

FIG. 3 shows an exemplary representation 300 of exemplary simulator components, artifacts, consumers, and providers. Using engine 302 a user can input the required san environment details. The engine 302 creates the object model for SMI-S arrays and switches, SNMP based switches, hosts (windows & UNIX hosts), VCenter (ESX server, VMs) and NAS arrays. The engine 302 creates the connectivity based on the inputted topology. The user can generate the corresponding artifacts. A NAS simulation module 308 and a virtualization simulation module 310 consumers respective configuration files 312, 314 as generated artifacts. While starting the NAS simulation, it reads the corresponding generated artifacts and generates the required object based on these artifacts. Whenever a management application sends XML API request to NAS simulation, it generates the corresponding response from the created object models When a management application sends a soap request to virtualization simulation, a soap response is constructed based on the object model created by virtualization simulation based on the corresponding artifacts. A SMI-S provider 316 having an XML reader 318 is integrated, and generated artifacts are parsed by XML reader. Whenever a management application sends a SMI request, a SMI-S provider serves the corresponding CIM response based on the objects created after parsing artifacts. Event trigger module 320 injects the events to the mapped SMI-S provider. Management application can discover SMI-S based arrays, switches, SNMP based switches, NAS arrays, hosts, ESX and VMs.

It is understood that a variety of artifacts can be constructed:

For SMI-S arrays and switches engine will generate XMLs and feed these XMLs in XML reader plugin, Engine will generate corresponding XMLs for WMI and SSH based hosts, and user has to feed the generated XMLs in corresponding ProSphere appliance to discover windows and UNIX hosts.

For VCenter simulation there is a separate simulation tool, and user has to feed the engine-generated configuration file to this tool.

For NAS simulation there is a spare simulation tool, and user has to feed the engine-generated configuration file and XMLs to this tool.

It is understood that a consumer can be considered to any management application interested in discovering and monitoring SMI-S based devices, WMI based & SSH based hosts, ESX servers, VM Hosts and NAS based arrays etc. It is further understood that a component can be considered to be independent software tools to enable a user to run any number of components in the same machine or in different machine. User has to feed the corresponding artifacts in these components accordingly. The main components are described below.

In the engine the user can input a required number of ESXs, VMs in each ESX, number of datastore, and the array required to connect the ESX etc. Based on this input, the user can generate the artifacts for VCenter simulation and then the user can feed this artifact wherever the VCenter Simulation tool is running.

The VCenter simulator 310 is integrated with tomcat server, for example, and the user can start the simulator by executing a batch file by feeding the engine-generated artifacts. The VCenter simulator is developed by providing the implementation of a stub published by vSphere Web Services SDK and WSDL, for example. DSF-VMWare webservice is based on JAX-WS and it is deployed in tomcat server. Therefore, whenever soap requests come to DSF-VMWare webservice the corresponding annotated method is executed and a required object will instantiate based on the input provided by artifacts. After that, JAX-WS will create the corresponding soap response and it will be served as real VCenter serving.

The XML reader plugin 318 is an independent software component that acts as a provider for SMI-S based arrays and switches. The engine generated CIM-XML will be deployed in Provider and XML Reader plug-in reads the XML and parse into CIM object. When a management application sends a CIM query to a provider an XML reader plug-in will serve the required information by fetching from this CIM object stored in provider memory.

The NAS simulator 308 is another independent software tool that simulates the XML API using servlets that are hosted in Apache Tomcat, for example. Using the XML API schema, we generated the NAS model stub using JAXB. The simulator constructs the NAS model using Config.Properties (all the static data like firmware version, model number etc.) and DSFConfig.Properties (all the variable attributes like WWN, name etc.). For the model parts concerning the back-end array, the simulator queries the DSF-ECOM which has the corresponding array and constructs the entire model. The details about the DSF-ECOM (IP, port etc) are provided in the ECOM.Properties.

The event trigger 320 is another utility tool which is used to trigger the events in provider. Event Trigger application uses the JAVA WBEMClient interface, for example, to invoke WBEM operations against the Provider. The user can input the required number of events in the configuration file. Once the file is modified it will start triggering events based on the new data. Trigger events use WBEMClient's invoke method to execute the specified method on the specified object. When events come to the DSF provider, XML Reader plug-in event handling module randomly selects the corresponding instance of that object from the available instance list (for switch Brocade_Switch instances and for arrays EMC_StorageSystem instances) and will do the corresponding instCreation, instDeletion or instModification operations.

Management applications can register events notification with DSF-ECOM provider. Trigger event will trigger the events in DSF-ECOM based on the scheduler and DSF-ECOM provider send corresponding notification to management application, which is registered for event notification.

For SMI-S provider support an ECOM framework was used and integrated with the XML Reader Plugin module to interpret the artifacts generated by DSF engine.

Figure 4:
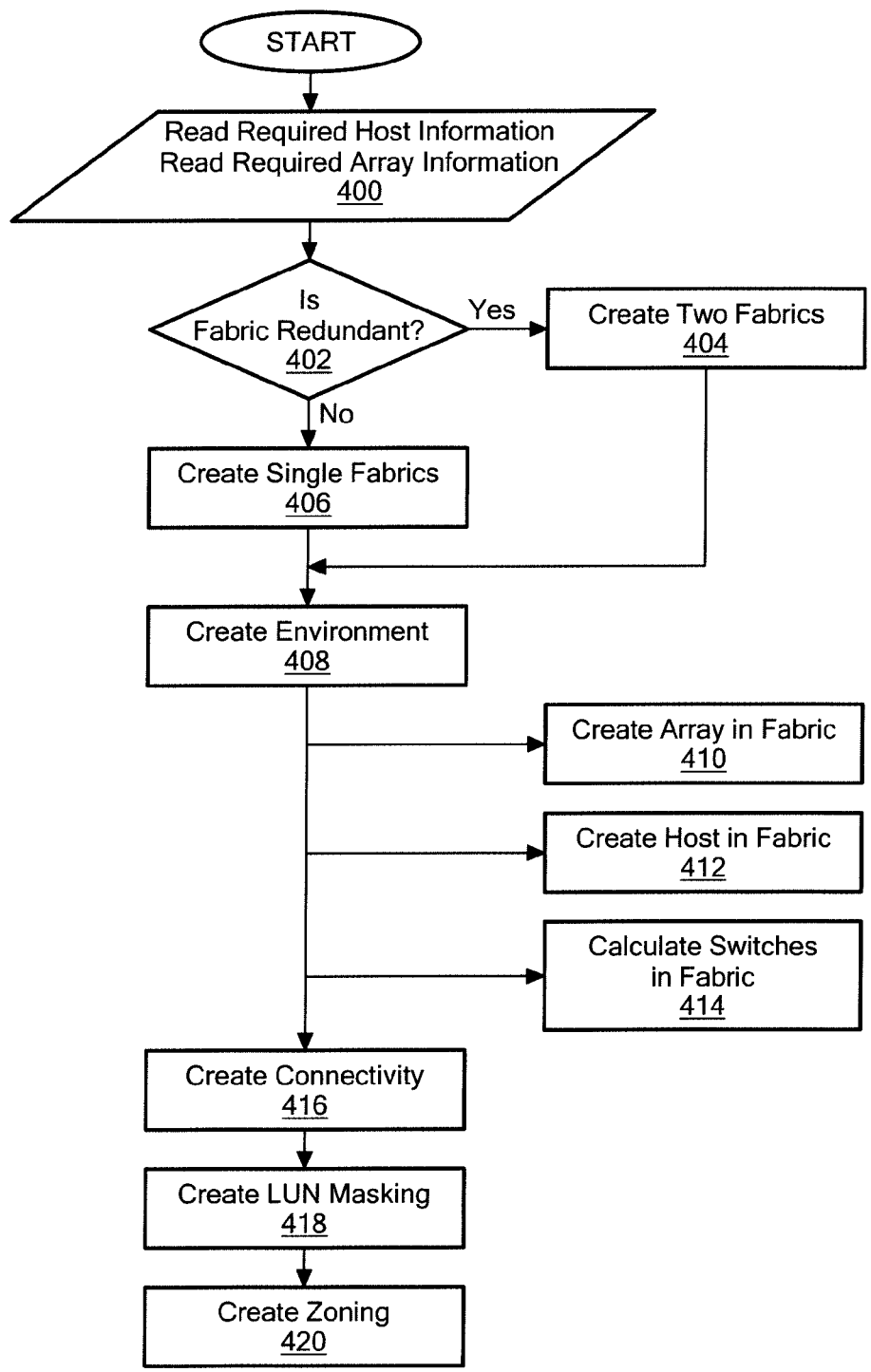
FIG. 4 is a flow diagram showing an exemplary sequence of steps for creating a simulated SAN environment.

FIG. 4 shows an exemplary sequence of steps for providing SAN simulation in accordance with exemplary embodiments of the invention. In step 400, the simulator reads the required host information and array information. Exemplary information includes: Host information:—

Host type (Windows or Unix Host)
Number of Hosts
Number of devices to be masked
Number of HBA
Number of ports per HBA
If it is ESX server then number VMs per ESX
Number of datastores
Array Information:—
Array type (Symmetrix,CLARiiON,V-MAx)
Number of arrays
Number of volumes per array
Total capacity of array
Number of ports
If it is NAS array, then number of DataMovers, number of File share In step 402, the system determines whether a fabric for the environment is redundant. If so, in step 404 the first and second fabrics are created. If the fabric was not redundant, single fabrics are created in step 406. In step 408, the simulation environment is created.

In step 410, the simulator creates an array in the fabric, a host in the fabric in step 412, and switches in step 414. In step 416, the connectivity for the environment is created based on the topology selection. In step 418, the LUN masking is created based on the number of devices configured for the host. In step 420, the zoning is created. The above is described more fully below.

Figure 5:
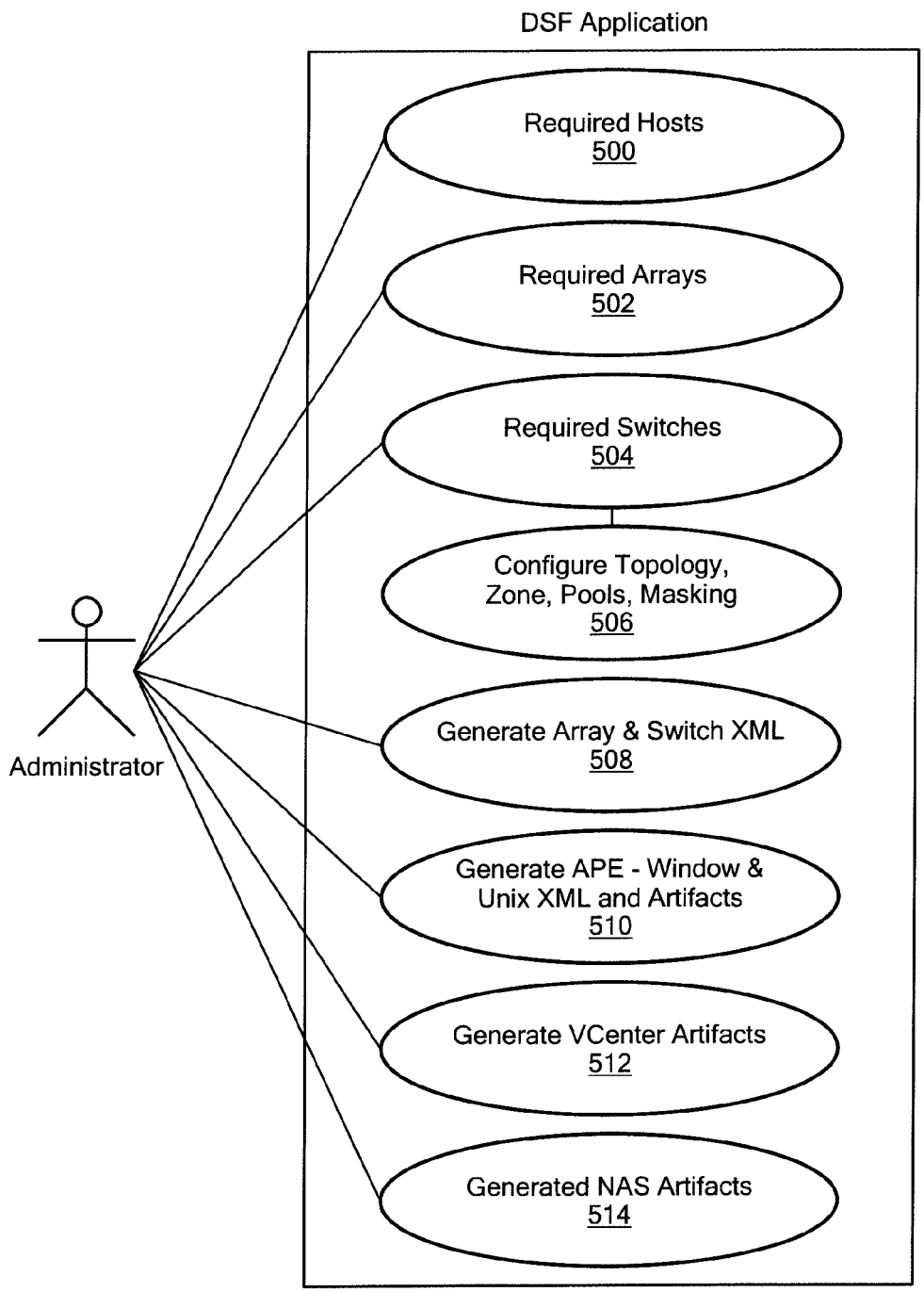
FIG. 5 is a diagram showing user interaction to create components in the simulated SAN environment.

As shown in FIG. 5, an administrator creates the simulation environment using a user interface, for example. In the illustrated embodiment, the administrator sets the required hosts 500, arrays 502, and switches 504, for the environment. Once the components are selected, the administrator configures the topology, zone, pools, and masking 506. It is understood that in physical implementations, the administrator performs the same tasks for the various physical components.

The administrator then generates array and switch XML 508, APE artifacts 510, virtualization artifacts 512, and NAS artifacts 514. In addition, the user provides a number of providers required for arrays and switches and required topology for connectivity.

In an exemplary embodiment, an XML reader plug-in operates as an OSLS plug-in. The XML reader plug-in extends the OSLS API. Generated CIM-XML is deployed in the provider and the XML reader plug-in reads the XML and parses into the CIM object. When a management application sends CIM query to the provider, the call comes to the OSLS API, instead of getting the information from live devices. The XML reader plug-in serves the required information by fetching from the CIM object stored in provider memory. In an exemplary embodiment, SMI-S array discovery and switch discovery is supported through the simulation provider, which supports performance data and event support data.

Figure 6A:
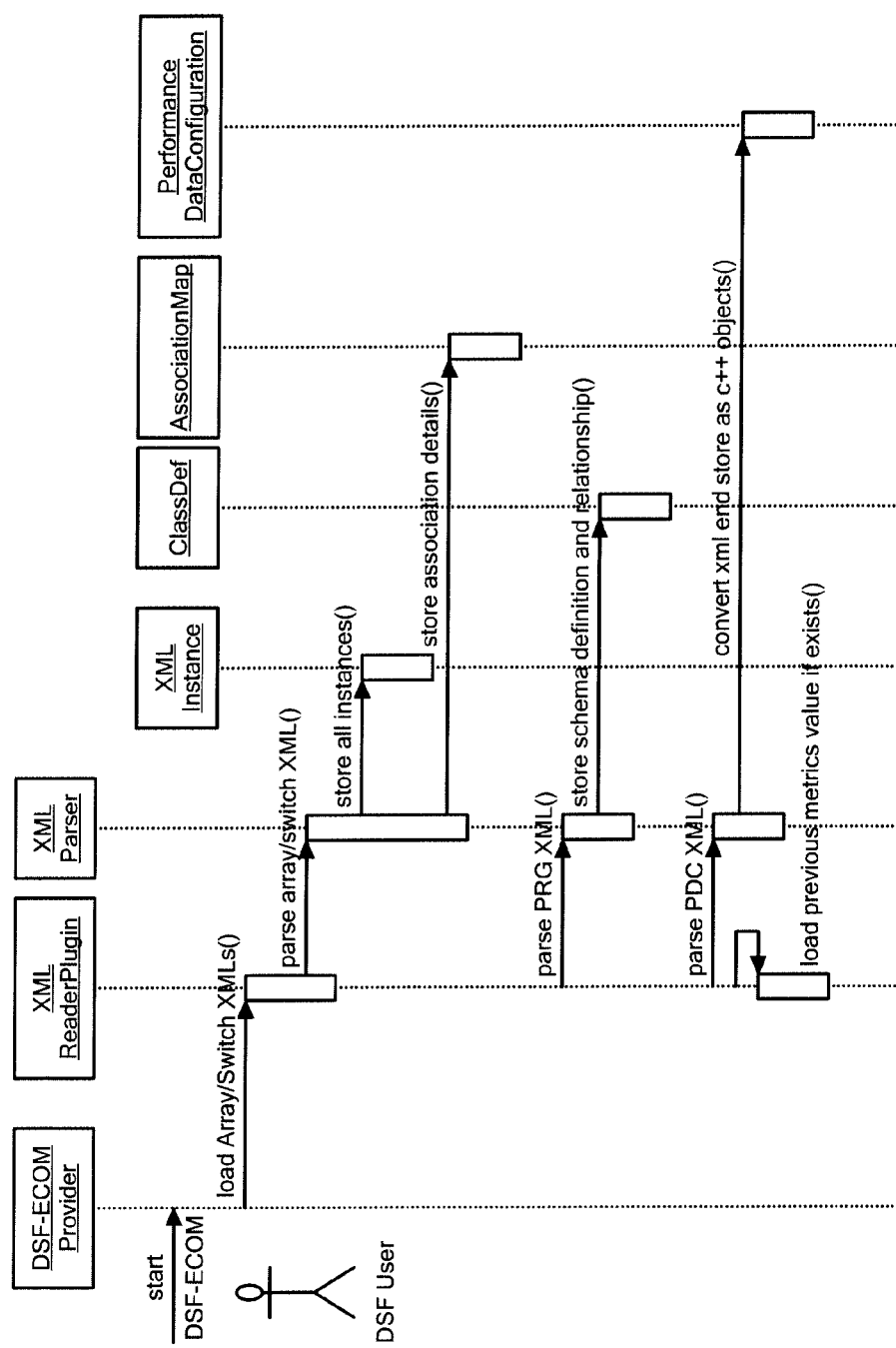
FIGS. 6A-D are sequence diagrams showing interaction between a user and SMI-S provider.
Figure 6B:
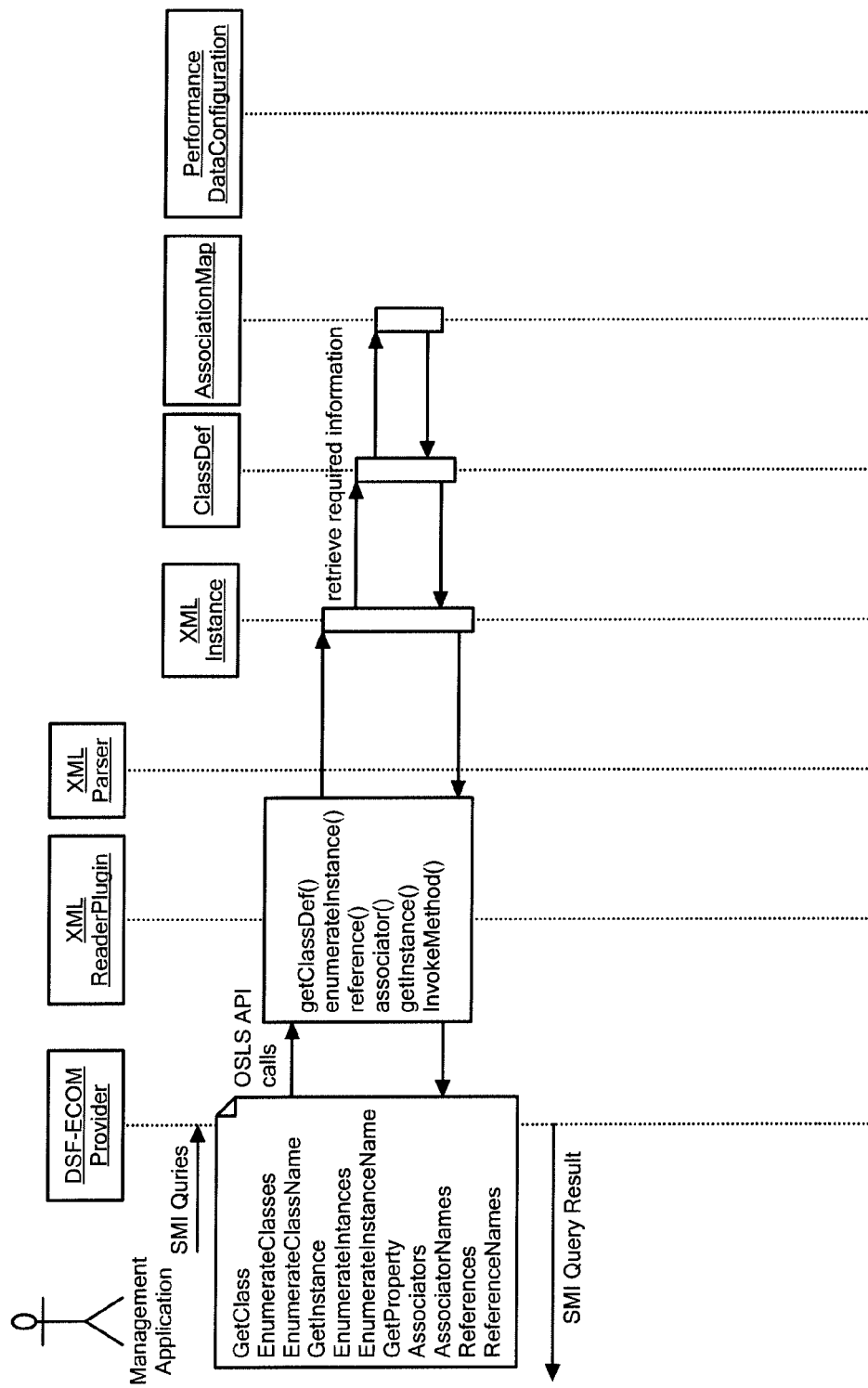
Figure 6C:
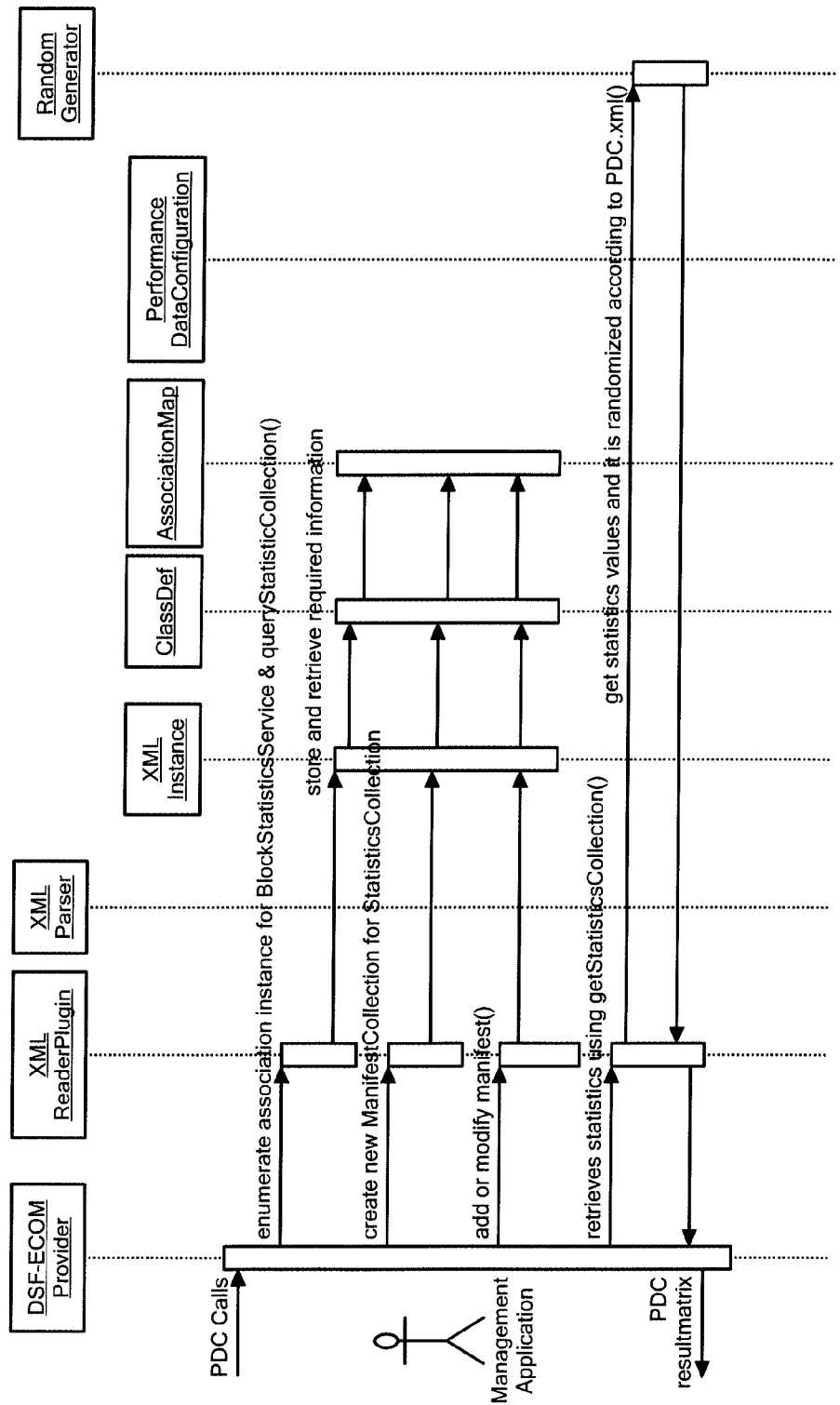
Figure 6D:
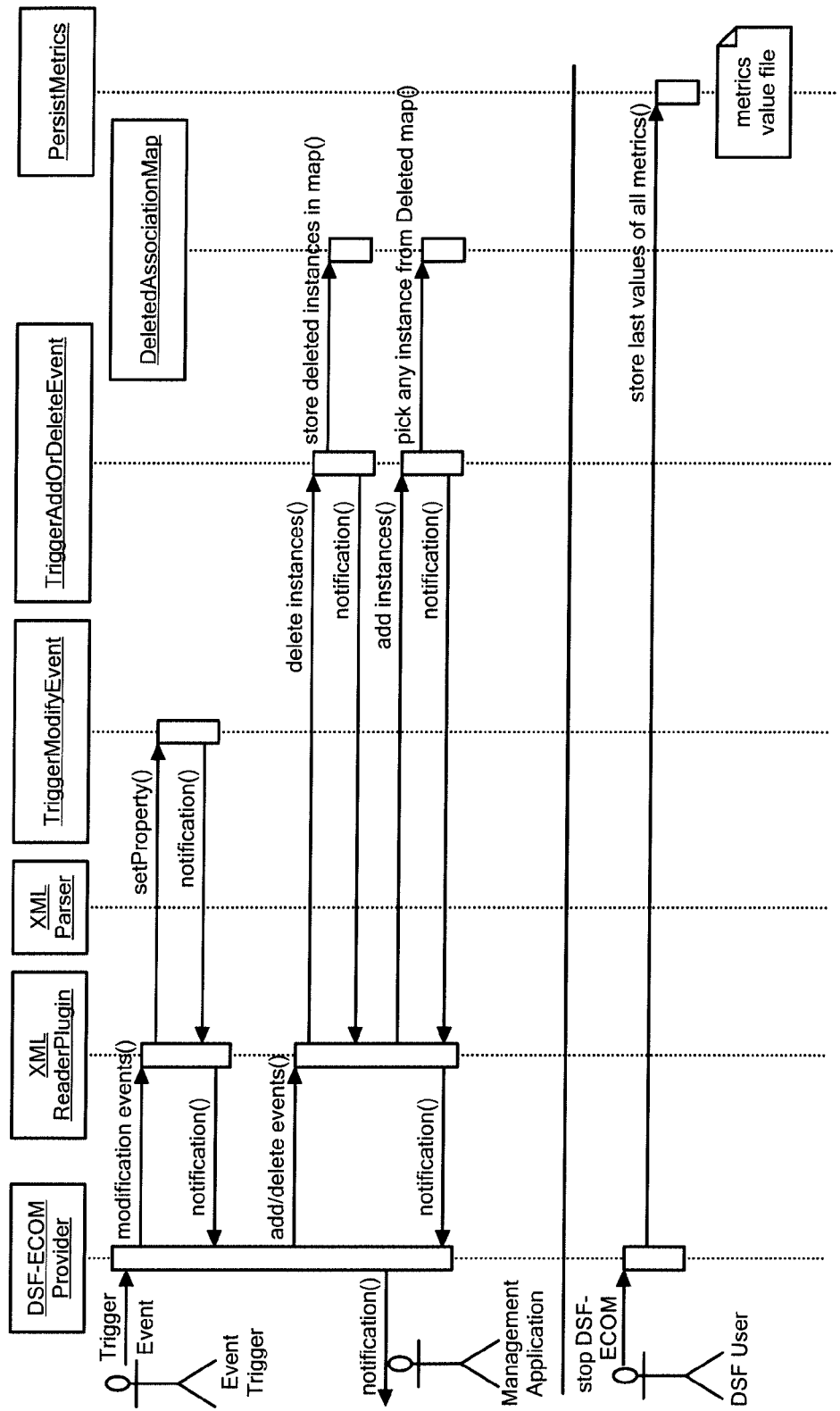

FIG. 6A shows an exemplary sequence for DSF-ECOM initialization. FIG. 6B shows an exemplary sequence for SMI Query execution. FIG. 6C shows an exemplary sequence for performance data collection calls. FIG. 6D shows an exemplary sequence for event notification and stop DSF-ECOM.

As noted above, for virtualization simulation, the simulator can configure a required number of ESXs, VMs in each ESX, number of datastores, and the arrays required to connect the ESX. The virtualization simulator, e.g., VCenter simulator, is integrated with a tomcat server, for example. The user can start the simulator by executing a batch file by feeding the generated artifacts.

In one embodiment, the system uses an implementation of a stub published by vSphere Web Services SDK and WSDL. DSF-VMware simulator is a webservice is based on JAX-WS and is deployed in tomcat server. When soap requests come to DSF-VMware simulator, the corresponding steps are executed and the required object will instantiate based on the input provided by the artifacts. After that, JAX-WS creates the corresponding soap response and it will be served as real VCenter serving.

Figure 7:
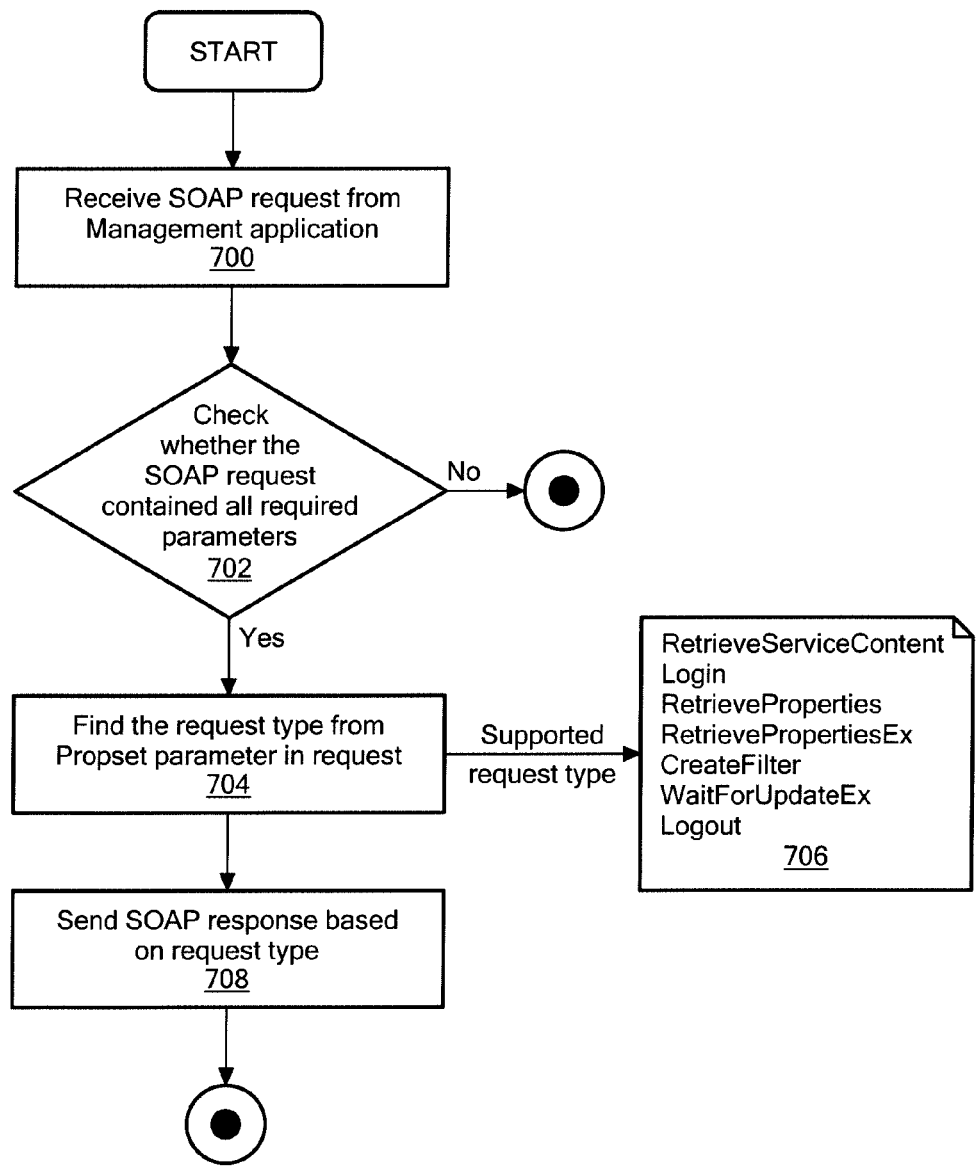
FIG. 7 is a flow diagram showing an exemplary sequence of steps for VCenter simulator responding to requests from a management application.
Figure 7A:
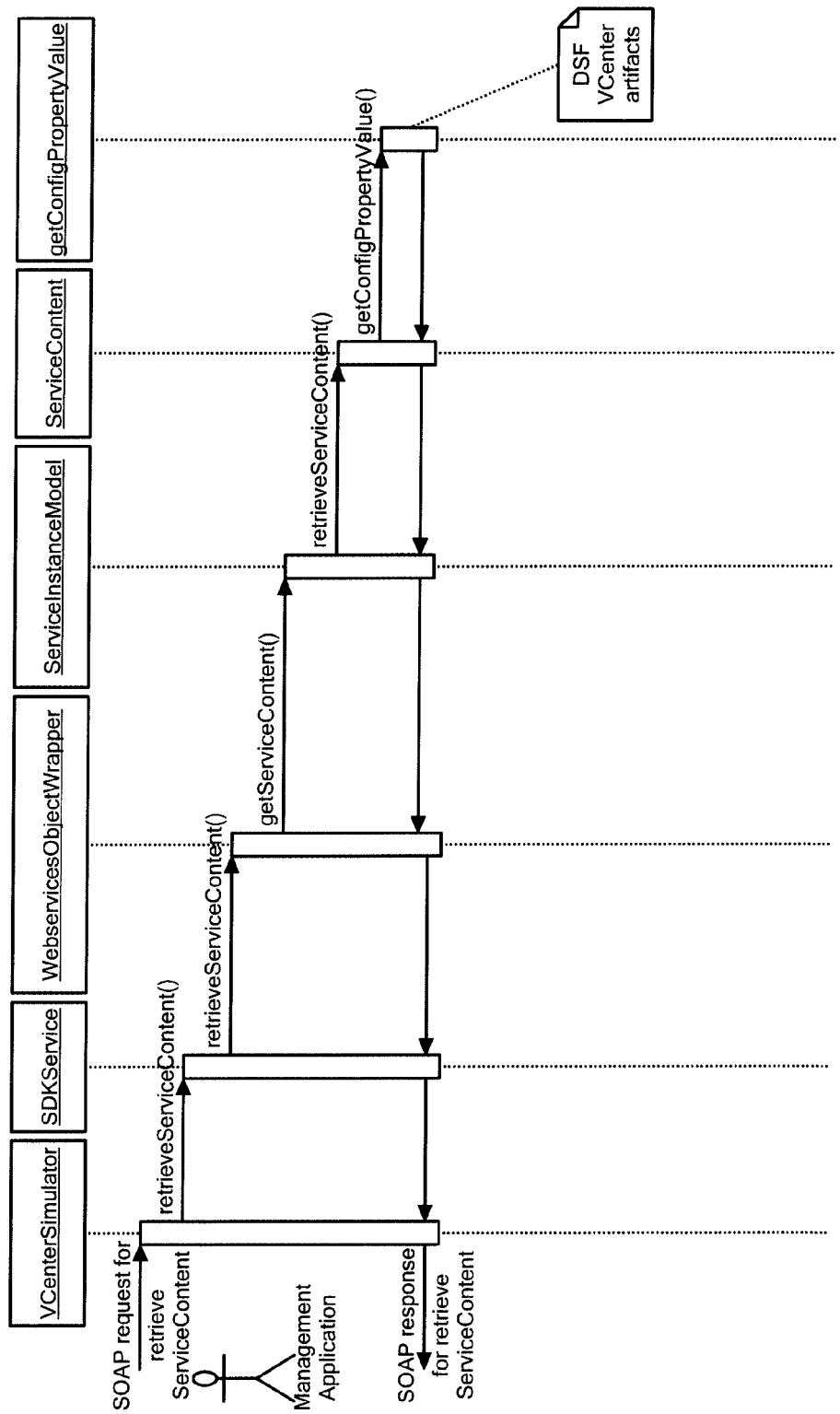
FIG. 7A is a sequence diagram showing interaction for the requests of FIG. 7.

FIG. 7 shows an exemplary VCenter retrieve service content sequence. In step 700, a SOAP request is received from a management application. The system determines whether the SOAP request contained the required parameters. If not, processing terminates. If so, in step 704, the request type is determined from the propset parameter in the request. As shown in 706, service content is received, properties are retrieved, and a filter is created. In step 708, a SOAP response is sent based on the request type. FIG. 7A shows an exemplary sequence diagram for the retrieve service content 706. It is understood that propset contains the information about the request type, for example request for retrieve the information about ESX etc. Below are exemplary request types:

RetrieveSrviceContent request
Login request
RetrieveProperties request
RetrievePropettiesEx request
createFilter request
WaitForUpdateEx request
Logout request In an exemplary embodiment, the simulator provides WINDOWS and UNIX simulation using active probe (FIG. 3, 322c)

In one embodiment, the simulator uses EMC PROSPHERE for simulating WINDOWS and UNIX hosts. EMC PROSPHERE is cloud storage management software to monitor and analyze storage services across virtual infrastructures, such as understanding how capacity is being used, identify conditions that require attention, and view performance trends to ensure consistent service levels.

The simulator generates a list of IPs and corresponding XML files for each host and deploys these IP files and XMLs in the PROSPHERE discovery appliance's ActiveProbe folder. The APE (Active Probe Engine) checks if the IP of the host to be discovered is a real host or an IP in the configuration file of DSF. If it is a real host, the real probe is done, otherwise the call is diverted to the simulation code which performs the task of converting the data from XML into appropriate format for SRM to consume. The simulated data is sent back, thereby bypassing the probe operation. Performance data support is available for simulated Window and UNIX hosts.

The call for host discovery comes from the UI to SDA in the following manner. We create the Discovery job containing Host IPs, Access credential information (SSH or WMI protocol) on the UI and trigger the discovery job. The translation of ApeObject to CM object is done by APE which is further sent to the Tomcat server.

Figure 8:
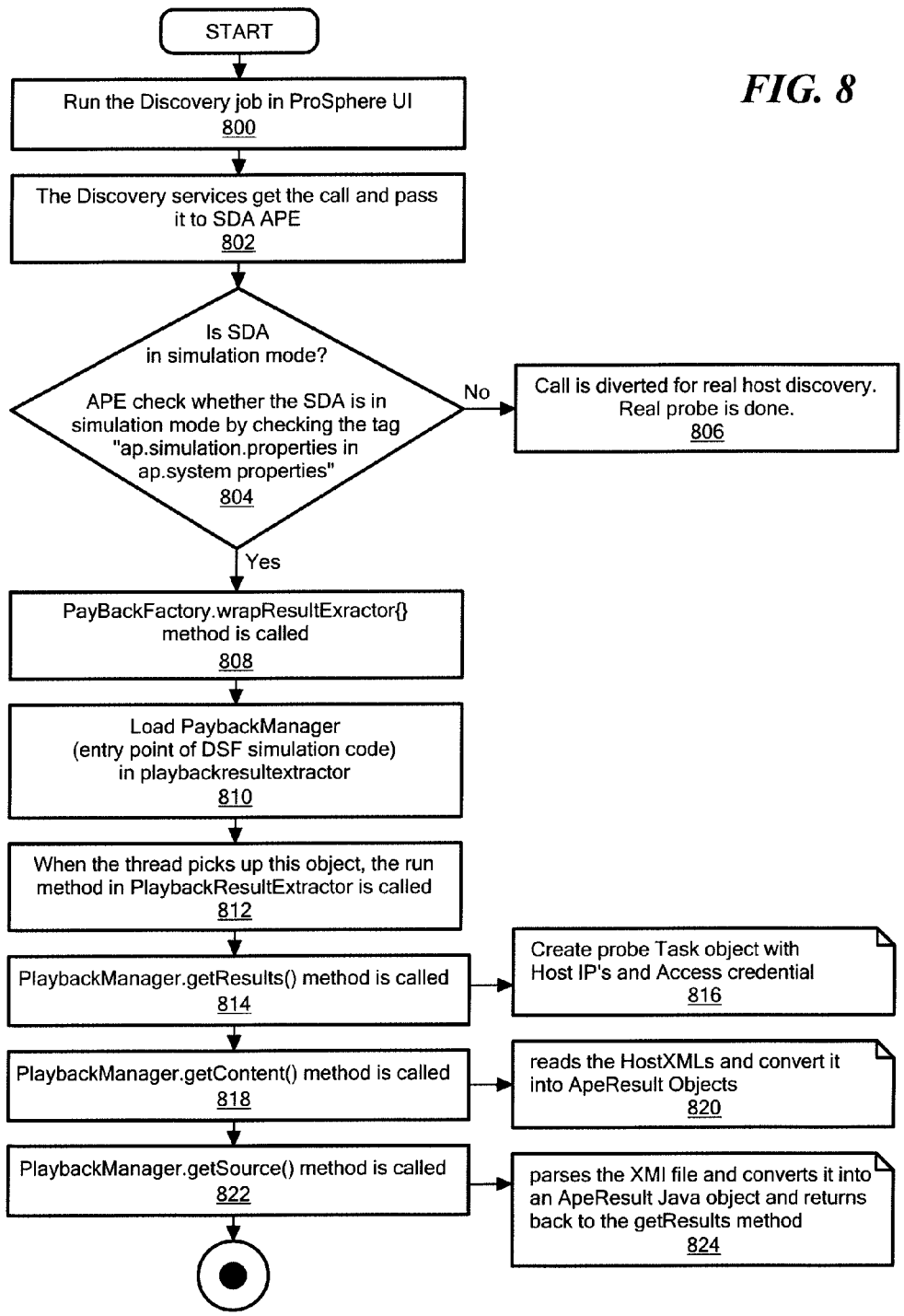
FIG. 8 is a flow diagram showing an exemplary sequence of steps for host discovery.

FIG. 8 shows an exemplary sequence of steps for host simulation. In step 800, cloud management runs discovery via a user interface. In step 802, the discovery services get the call and pass it to the SDA APE. In step 804, the system determines if the SOA is in simulation mode, such as by the APE checking whether the SDA is in simulation mode by checking a flag. If not, the call is diverted for real host discovery in step 806. If so, in step 808 a result extractor is called and in step 810. In step 812, result extractor is called when the thread picks up the object. In step 814, a get result call is made. A probe task object is created with the host IPs and access credentials 816. In step 818, a get content call is made which reads the host XMLs and converts to APE result objects 820. In step 822, a get source call is made which parses the XML file and coverts to an APE object 824. It is understood that playback manager takes care of sponning the thread, and each thread will extract xmls and then create corresponding java object and then convert them to cim object format.

Figure 9:
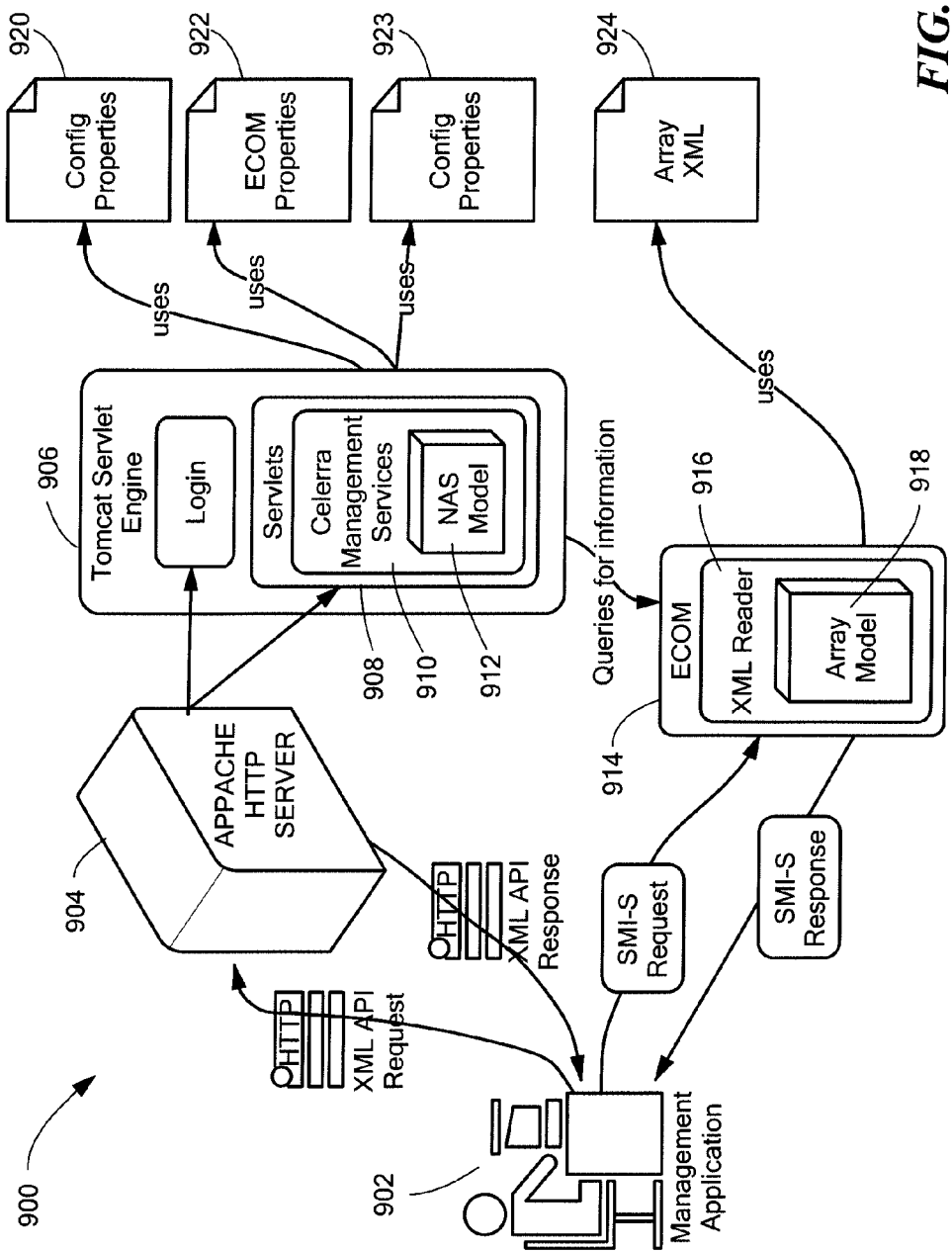
FIG. 9 is a schematic representation of an exemplary NAS XML-API simulation implementation.

FIG. 9 shows an exemplary NAS simulator configuration 900 including a management application 902 coupled to a server 904, such as an apache http server, having a servlet engine 906 with a servlet module 908 with management services 910 and a NAS model 912. The servlet engine 906 can query an ECOM module 914 having an XML reader 916 with an array model 918. The servlet engine 906 and DSF-ECOM module 914 can obtain various information, from DSF artifacts like configuration properties 920, ECOM properties 922 and array XML 924. As is known in the art, ECOM is an acronym for the EMC Common Object Manager. As used herein, like other vendor names, it is understood that ECOM refers to any suitable common framework for object manager.

NAS devices expose a XML API interface for remote management. The XML-based application protocol defines the schema for request, response, and indication messages. The application can send request packets to the XML API server by using HTTP POST requests. Basically, a request and response that is carried by the session layer in the body of the HTTP POST request is a complete XML document. The first request also establishes a session between the application and the XML API Servlet. The XML API is defined in terms of W3C XML Schema. Data and message objects are defined in the schema files.

The NAS simulator simulates the XML API using servlets that are hosted in an Apache Tomcat device 904, for example. Using the XML API schema, the system generates a NAS model stub using JAXB. The simulator constructs most of the NAS model using Config.Properties 920 (static data, such as firmware version, model number etc.) and Config.Properties 923 (variable attributes such as WWN, name etc.). For the model parts concerning the back-end array, the simulator queries the ECOM 914 which has the corresponding array 918 and constructs the entire model. The details about the ECOM (e.g., IP, port etc) are provided in the ECOM.Properties 922. The servlets 908 use JAXB to unmarshal and marshal requests and responses. Based on the request parameters, the servlet builds the response and sends it back to the management client 902.

An event trigger utility is used to trigger the events in the simulator. An event trigger application uses the JAVA WBEMClient interface to invoke WBEM operations against the provider. The user can input the required number of events in configuration file. Once the file is modified it will start triggering events based on the new data. Trigger events use WBEMClient's invoke method to execute the specified method on the specified object. When events come to the provider, XML reader plug-in event handling module selects the corresponding instance of that object from the available instance list (for switch Brocade_Switch instances and for arrays EMC_StorageSystem instances) and will do the corresponding instCreation, instDeletion or instModification operations.

The management application can register events notification with DSF-ECOM. A trigger event triggers the events in DSF-ECOM based on the scheduler and DSF-ECOM provider sends corresponding notification to management application, which is registered for event notification.

Exemplary events supported by the simulator include:
Array Active management:—
  Pool management:—pool creation, pool deletion etc.
  Volume Management:—volume creation, volume deletion, create snapshot of a volume, disable\Enable array ports etc.
Fabric Active management:—Supports event related to Zoning, like zoning creation, zone member add etc.
Switch Active management:—disable a switch, set Principal switch and port enable disable etc.

Figure 10:
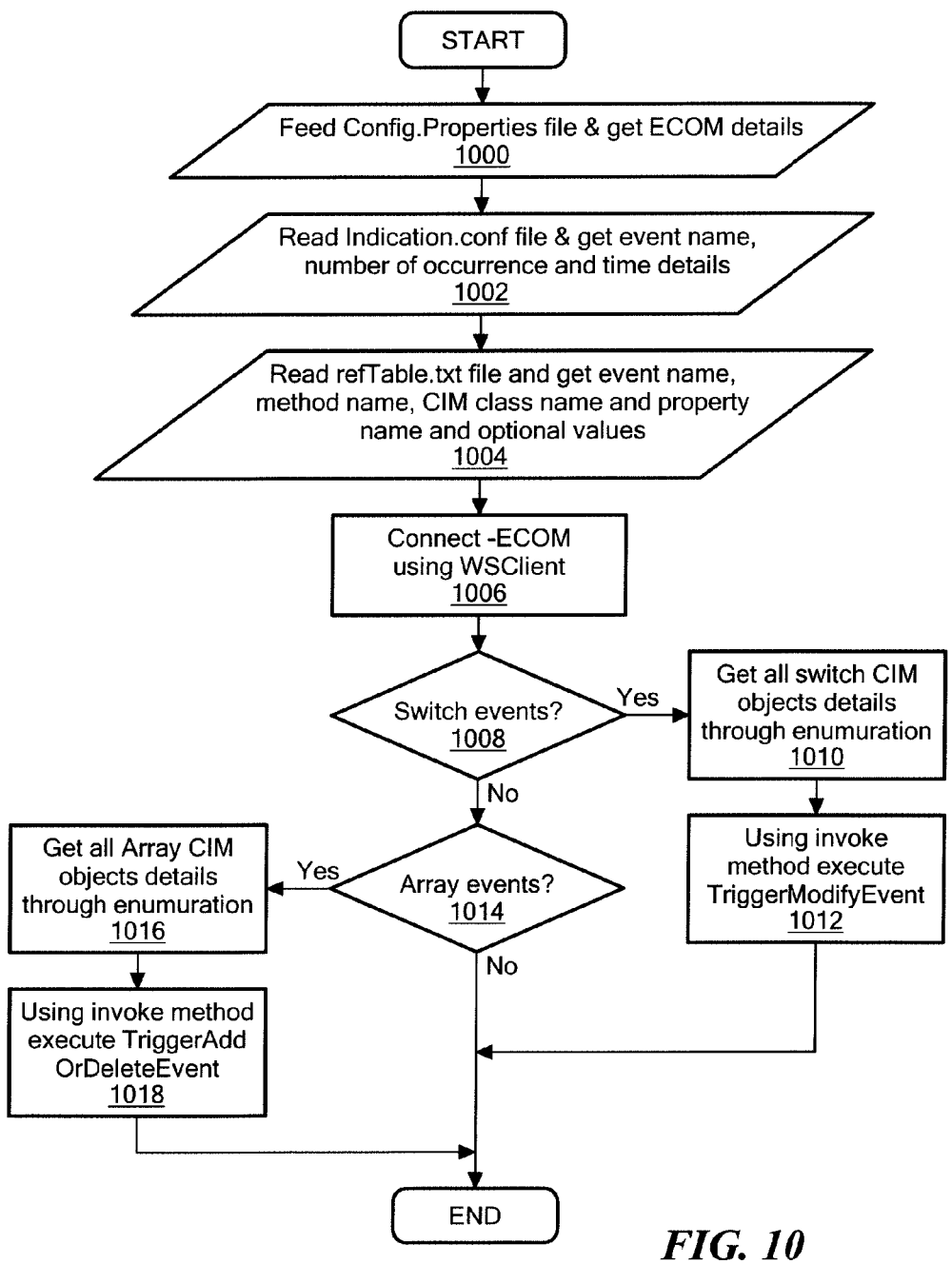
FIG. 10 is a flow diagram showing an exemplary sequence of steps for event triggering.

FIG. 10 shows an exemplary sequence of steps for implementing event triggering. In step 1000, the simulator reads configuration properties and obtains ECOM details. In step 1002, an indication configuration file is read to get an event name, number of occurrences, time information, etc. In step 1004, a reference table is read to obtain the event name along with the event name, method, CIM class, property name, and values.

In step 1006, Trigger Event will connect ECOM using WSClient with the credentials and ECOM IP and port details, for example. In step 1008, it is determined whether there are any switch events. If so, in step 1010, the system gets the switch CIM object details through enumeration and in step 1012 the system invokes a trigger modify event method and processing terminates. If not, it is determined in step 1014 whether there are any array events. If so, the system gets array CIM objects details through enumeration in step 1016 and invokes a method to execute a trigger add/delete event and processing terminates.

In exemplary embodiments of the invention, a SAN simulator can generate a SAN environment with end-en-end connectivity. A user can select the desired SAN environment according to the requirements based on the complexity, such as large, medium and small, illustrative sizes are set forth below in Table 1 for storage in a configuration file.

TABLE 1

| SAN env Type | Scale | Windows Hosts | | | Unix Hosts | ESX | Symmetrix | CLARiiON | V-Max |
|---|---|---|---|---|---|---|---|---|---|
| | | Small Hosts | Medium Hosts | Large Hosts | | | | | |
| Small | 25% | 1073 | 286 | 71 | 970 | 100 | 20 | 37 | 5 |
| Medium | 50% | 2145 | 572 | 143 | 1940 | 200 | 40 | 75 | 10 |
| Large | 100% | 4290 | 1144 | 286 | 3880 | 400 | 80 | 150 | 20 |

The user can select the desired environment (e.g., large, medium, small) and the simulator takes care of the internal complexity. The simulator takes care of the end-to-end connectivity and determines how many ISLs/ICLs required between core-to-core switch, core to edge switch by taking care of fail over cases and ISL ratio practices. The simulator support different ways of zoning that can be grouped by array, by host operating system, by application, and/or by location within the data center. The arrays volume creation and with mapping and masking performed by the simulator. Array volumes are distributed in appropriate pools.

In one embodiment, the simulator can compute Performance Data Collection (PDC) for SMI Arrays, switches, VCenter and APE Windows and UNIX hosts. Performance metrics are dynamically generated based on the range mentioned in the configuration file.

The simulator can also allow the user perform active management for arrays, switches, fabric, VCenter and NAS devices. The user can execute the scheduler with the required events. If any event triggered, then corresponding child events and dependent association maintains event consistency.

In array active management, the simulator supports pool related events, volume related events and array port related events:
Pool management:
  Storage Pool Creation
  Storage Pool Expansion
  Storage Pool Removal
Volume Management
  Volume Creation (create a new volume in a storage pool using default settings)
  Volume Expansion (expand the capacity of a volume in a storage pool)
  Volume Removal (remove an existing volume from a storage pool)
  Export a Volume (like creating a storage group and adding the volume and host HBAs into it)
  Unexport a Volume (Delete the storage group)
  Create Snapshot of a Volume
  Delete Snapshot of a Volume
  Restore a Volume from a snapshot
  Export a Volume Snapshot
  Unexport a VolumeSnapshot Volume—FC Target Port—HBA Initiator Allocation Creation Volume—FC Target Port—HBA Initiator Allocation w/ Volume Addition Volume—FC Target Port—HBA Initiator Allocation w/ HBA Initiator Addition Volume—FC Target Port—HBA Initiator Allocation w/ FC Target Port Addition Volume—FC Target Port—HBA Initiator Allocation w/ Volume Removal Volume—FC Target Port—HBA Initiator Allocation w/ HBA Initiator Removal Volume—FC Target Port—HBA Initiator Allocation w/ FC Target Port Removal Volume—FC Target port—HBA Initiator Allocation Removal Fabric Active Management In fabric active management mainly supports event related to Zoning.

Zone Create (Create a new zone in a fabric)

Zone Add Member (Add a new member, a port or a WWN, to an existing zone)

Zone Remove Member (Remove a zone member, a port or a WWN, from a zone)

Zone Delete (Delete a zone)

Zoneset Create (Create a new zoneset with one or more members in a fabric)

Zoneset Add Member (Add a zone to a zoneset)

Zoneset Remove Member (Remove a zone from a zoneset)

Zoneset Delete (Delete a zoneset)

Zoneset Activate (Activate an existing inactive zoneset in a fabric)

Zoneset Deactivate: (Deactivate an existing active zoneset in a fabric)

Switch Active Management

Disable (disable a switch)

Set Principal (set the principal priority of a switch)

Set Name (set the user-friendly name of a switch)

Set Domain (set the preferred domain ID of a switch)

Lock Domain (lock the domain ID of a switch)

Enable (enable a switch)

Reset (can reset a switch)

Port Enable (can enable a port on a switch)

Port Disable (can disable a port on a switch)

Port Set Speed (set the speed of a port on a switch)

Port Set Type (can set the type, such as Fabric, FC-AL, etc, of a port on a switch)

Port Set Name (Validate that the software can set the user-friendly name of a switch port) NAS Active Management Create a fileshare (Celera file)

Delete a fileshare

Export a fileshare—Mounting a fileshare (NFS or CIFS) to a host via Datamovers

Unexport a fileshare—unmounts FS

Create a Snapshot for file

Delete a Snapshot for file

Restore a file from a snapshot

Export a File Snapshot

Unexport a File Snapshot

VCenter Active Management

DSF VCenter simulation can simulate event.

Events are sent by vCenter to convey information about things that happen in the system, and it include user actions and system actions that occur on datacenters, datastores, clusters, hosts, resource pools, virtual machines, networks, and distributed virtual switches. For example, these common system activities generate one or more Event data objects:

Powering a virtual machine on or off

Creating a virtual machine

Reconfiguring a compute resource

Adding a newly configured ESX/ESXi system to a vCenter Server system

In exemplary embodiments, a simulator can support any SMI based Storage arrays, such as EMC Symmetrix, CLARiiON and V-Max model of arrays. The arrays can be simulated based on profiles recommended by SNIA. The simulator can simulate millions of volumes and mask them to corresponding hosts.

In conformity with best practice, more hosts accessing the same LUNs means more overhead, so the simulator will not mask the single LUN with multiple hosts. And in the case of mapping, the simulator will map the same volume with different storage processor front end ports. For example, in the case of CLARiiON, LUN1 will be mapped from SP-A port 1 and SP-B port 1. For the failover case, SP-A and SP-B ports will be connected through different switch/fabric. So host will have different data paths to both SP-A and SP-B.

The simulator can simulate disks, LUNs, storage pools, raid levels, mapping and masking in a manner similar to physical arrays. The capacity profile supported by simulator is dynamic so that one can see the capacity matrices (e.g., remaining space, consumed space, pool free, pool used, capacity trend etc.) changing according to the usage.

While generating the simulated arrays, in one embodiment the simulator creates about 208 raw disks and each disk will have the default block size 512. From the disk information, LUNs will be created based on the calculation of total capacity size divided by number of volumes. Created LUNs will map the LUNS with Font End port of SP-A, SP-B (for CLARiiON) or Engine-A, Engine-B (for Symmetrix and V-Max). After that, all LUNs will be assigned to the primordial storage pool.

In exemplary embodiments of the invention, the simulator can enforce best practices. The user can have the option to follow or deviate from the rules and best practices.

Topology Best Practices

The simulator can support two categories of topologies Simple and Complex Fibre channel topologies. Simple Fibre Channel SAN comprises less than four Directors and switches connected by ISLs and has no more than two hops. And in complex Fibre Channel SAN comprises four or more Directors and switches connected by ISLs and has any number of hops.

In Simple Fibre Channel SAN topology the simulator can support the following patterns:

Single switch fabrics:—Single switch fabric consists of only a single switch and both the host and storage ports are located on the same switch. Simulated model—Brocade Silkworm 4100 series and Brocade 200E Two switch fabrics:—Contain two switches and the switches are connected using two ISLs.

Cascaded fabrics:—Cascaded fabric is a set of interconnected switches, arranged in a tree format, that have one or more ISLs. One can connect one switch to one or more switches using a single ISL to each, or connect a pair of ISLs between two switches. According to the best practice minimum of two ISL connections on each switch to provide fabric path redundancy.

Simulator supported Complex Fibre Channel SAN topologies also:

Four switch full mesh:—Each switch is connected to every other switch with a minimum of two ISLs. This prevents any ISL from becoming a single point of failure.

Edge-Core-Edge fabric:—In this SAN tiered topology, every core switch is connected to every other core switch, host edge switches and array edge switch will be connected to core switch.

The number of ISLs between edge and core switches is expressed as a fan-in ratio. For finding the core and edge switches DSF uses the following exemplary formulas and assumptions.

Minimum Fabric Count:

Each Fabric can have a maximum of 5000 switch ports. In that 60% of the ports are used for connecting to the device ports. The remaining ports can be used for ISLs.

Minimum Fabric Count=ceil (Total Device Ports/3000)

Device Ports per Fabric=ceil (Total Device Ports/Minimum Fabric Count)

Total Device Ports==Total Array Ports+Total Host Ports

Minimum Edge Switches Per Fabric:

In each and every Edge switch, a certain amount of the ports are used for ISLs and the remaining ports can be used for connecting to Host or Array.

Minimum Edge Switch Count=Device Ports per Fabric/(Edge Switch Size*4/5) [4/5 for over-subscription ratio.]

Minimum Core Switch Count:

2*(Minimum Core Switches)^2+Minimum Edge Switch Count*(Edge Switch Size*1/5) Core Switch Size*Minimum Core Switches Each core switch is connected with other core switch by 4 ISLs. So, each core switch should have at least 4*(Minimum Core Switches) ports for connecting to other core switches. Thus, a Fabric should have [Minimum Core Switches*(4*Minimum Core Switches)] core switch ports for core-core connection.

Similarly, each core switch is connected with edge switches according to the over-subscription ratio. In one case, its 5:1. So, each core switch should have at least [(Minimum number of edge switches*(edge switch size*1/5))] ports for connecting to edge switches.

The addition of (1) and (2) is equal to the minimum number of core switch ports in that fabric.

That is equal to Minimum Core Switch count*Core Switch size.

Minimize the number of hops between devices that communicate regularly in the SAN.

ISL Subscription Best Practice

Based on how many host and storage pairs utilize the ISLs between domains, the simulator can determine the count of ISLs. For two switch fabric, one can provide minimum of two ISLs between them and there are no more than six initiator and target pairs per ISL. For example, if 14 initiators access a total of 14 targets between two domains, a total of three ISLs would be necessary. In one design, it is ensured that the SAN environment provides an adequate number of ISLs between switches, and minimize cases where many devices share a single-switch ISL. Advanced users can configure the ISL ratio in configuration file.

In Edge-Core-Edge fabric topology design, a core switch is connected with edge switches according to the over-subscription ratio. In one case, it is 5:1 and the first number (5) indicates the number of edge ports. The second number (1) indicates the number of ISLs used by the edge ports to connect to a core switch in the fabric. So, each core switch should have at least [(Minimum number of edge switches*(edge switch size*1/5))] ports for connecting to edge switches.

Domain limit and maximum switch and switch ports supported in a fabric also taken care as part of the best practice. At a minimum core switches should be of equal or higher performance compared to the edges. Assigned highest performance switch in the fabric to be the principal switch. Core switches are cross-wired to provide full fabric connectivity in case a core fails.

The simulator can simulate the ISL with different speeds, and for switch ports also the user can assign different speed values.

ISL Over-Subscription=((Average of Node Speeds/ISL Speed)×Number of Nodes): Number of ISLs One aspect of SAN topology is the resiliency and redundancy of the fabric. One objective is to remove any single point of failure. Resiliency is the ability of the network to continue to function and/or recover from a failure, while redundancy describes duplication of components, even an entire fabric, to eliminate a single point of failure in the network.

In exemplary embodiments, the simulator has Multi fabric support and servers and storage connected using a pair of redundant fabrics, so if one fabric goes down the other will take over to ensure multiple data paths between servers and storage systems. Multiple ISLs between the core switch and edge switch provide redundancy in case an ISL or switch port fails.

Each host will have multiple HBAs and if one HBA failed then the other HBA will take over. Multi fabric option is enabled then each HBA is connected to different fabric, otherwise each HBA is connected to different switch in the same fabric. So if one switch failed then the other will take over.

To handle the array failover case, the simulator will map the same volume with different Storage Processor's front-end ports. So that host will have different data path and if any path failed it will take care by the other path. So the simulator ensures that if a switch, server HBA, or storage system path failure occurs, data is automatically rerouted through the alternate fabric without any interruption.

In exemplary embodiments, the simulator supports different types of zoning. The user can select the desired zoning based on the requirements. The simulator prevents a host from unauthorized access of storage assets, but it also stops undesired host-to-host communication and fabric-wide Registered State Change Notification (RSCN) disruptions. There are many ways to group SAN host and storage nodes for a particular Zoning configuration. Zone membership is primarily based on the need for a host to access a storage port. Hosts rarely need to interact directly with each other and storage ports never initiate SAN traffic by virtue of their nature as targets. Zones can be grouped by array, by host operating system, by application, or by location within the data center.

In one embodiment, by default the simulator supports industry recommended zoning called "Single HBA Zoning" (Single Initiator Zoning (SIZ)) if the user is not selecting any zoning preferences. In this zoning pattern, each zone has only a single HBA and one or more storage ports. In this zoning pattern, SIZ is optimal because it prevents any host-to-host interaction and limits RSCNs to just the zones that need the information within the RSCN.

Glossary:

CIM: The Common Information Model is an object-oriented information model defined by the Distributed Management Task Force (DMTF), which provides a conceptual framework for describing management data.

SMI-S: The Storage Management Initiative Specification, sponsored by Storage Network Industry Association (SNIA), is emerging as the most widely accepted management standard for the storage industry. SMI-S specifies a set of profiles on CIM and WBEM.

WBEM: Web Based Enterprise Management is an umbrella term for a set of DMTF defined protocols for accessing CIM based infrastructures. These protocols include CIM Operations over HTTP together with CIM-XML and the Command Line Protocol.

Figure 11:
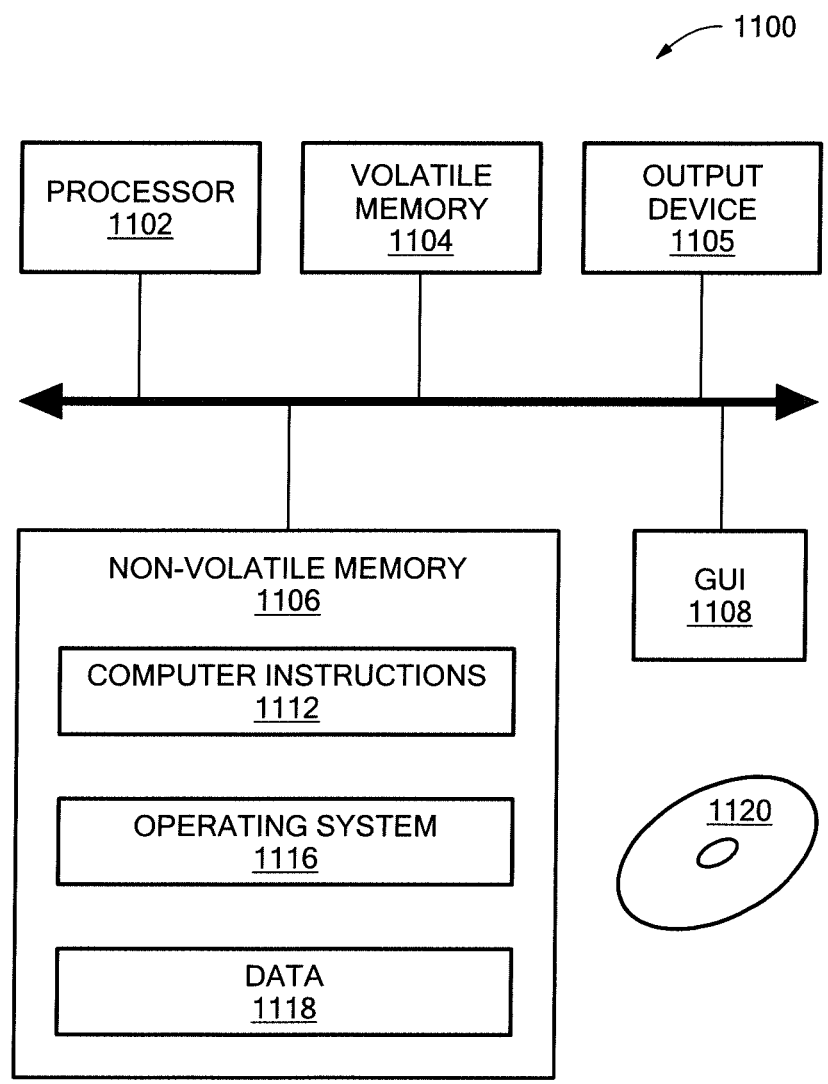
FIG. 11 shows and exemplary computer that can perform at least a portion of the processing described herein.

FIG. 11 shows an exemplary computer 1100 that can perform at least part of the processing described herein. The computer 1100 includes a processor 1102, a volatile memory 1104, a non-volatile memory 1106 (e.g., hard disk), and a graphical user interface (GUI) 1108 (e.g., a mouse, a keyboard, a display, for example). The non-volatile memory 1106 stores computer instructions 1112, an operating system 1116 and data 1118, for example. In one example, the computer instructions 1112 are executed by the processor 1102 out of volatile memory 1104. In one embodiment, an article 1120 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers)). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method, comprising:
   simulating a SAN environment comprising:
   receiving user input for the simulated SAN environment,
   obtaining information for hosts in the simulated SAN environment;
   obtaining information for arrays in the simulated SAN environment; and
   generating, using a computer processor, the simulated SAN environment on a computer by implementing the information for the hosts obtained, the information for the arrays obtained and the user input received, the generating comprising:
   for a fabric, generating the arrays, the hosts, and calculating a number of switches required for the fabric based on a number of the hosts and a number of the arrays;
   determining connectivity for components in the simulated SAN environment;
   determining storage for the simulated SAN environment including LUN masking and mapping;
   determining zoning based upon the storage; and
   triggering events for the simulated SAN environment comprising:
   reading configuration properties file from a simulator configuration;
   obtaining common object manager (COM) details from the configuration properties file;
   obtaining events from an indication configuration file;
   accessing COM using the COM details;
   obtaining switch object details and invoking a trigger modify event if there is a switch event after accessing the COM; and
   obtaining array object details and executing a trigger add/delete event if there is an array event after accessing the COM.

2. The method according to claim 1, further including configuring storage pools from the storage.

3. The method according to claim 1, further including determining end-to-end connectivity from a host to the storage.

4. The method according to claim 1, further including determining zoning for the arrays.

5. The method according to claim 1, further including simulating a virtualization application for the SAN environment.

6. The method according to claim 1, further including simulating NAS storage.

7. The method according to claim 1, further including performing dynamic performance data collection for the simulated SAN environment including for switches, hosts and arrays.

8. The method according to claim 1, further including determining whether a first switch for the fabric is redundant.

9. The method according to claim 1, wherein the hosts comprise WINDOWS and UNIX systems.

10. The method according to claim 1, further including minimizing points of failure in the SAN environment.

11. The method according to claim 1, further including handling a failover for the SAN environment.

12. The method according to claim 1, further including supporting dynamic capacity metrics for usable capacity, usable capacity by pools.

13. An article, comprising:
a computer readable medium containing non-transitory stored instructions that enable a machine to simulate a SAN environment by:
receiving user input for a simulated SAN environment,
obtaining information for hosts in the simulated SAN environment;
obtaining information for arrays in the simulated SAN environment; and
generating, using a computer processor, the simulated SAN environment on a computer by implementing the information for the hosts obtained, the information for the arrays obtained and the user input received, the generating comprising:
for a fabric, generating the arrays, the hosts, and calculating a number of switches required for the fabric based on a number of the hosts and a number of the arrays;
determining connectivity for components in the simulated SAN environment;
determining storage for the simulated SAN environment including LUN masking and mapping;
determining zoning based upon the storage; and
triggering events for the simulated SAN environment comprising:
reading configuration properties file;
obtaining common object manager (COM) details from the configuration properties file;
obtaining events from an indication configuration file;
accessing COM using the COM details;
obtaining switch object details and invoking a trigger modify event if there is a switch event; and
obtaining array object details and executing a trigger add/delete event if there is an array event.

14. A system to simulate a SAN environment, comprising:
at least one processor;
at least one memory coupled to the at least one processor, the at least one processor and the at least one memory configured to simulate a SAN environment by:
receiving user input for a simulated SAN environment,
obtaining information for hosts in the simulated SAN environment;
obtaining information for arrays in the simulated SAN environment; and
generating, using a computer processor, the simulated SAN environment on a computer by implementing the information for the hosts obtained, the information for the arrays obtained and the user input received, the generating comprising:
for a fabric, generating the arrays, the hosts, and calculating a number of switches required for the fabric based on a number of the hosts and a number of the arrays;
determining connectivity for components in the simulated SAN environment;
determining storage for the simulated SAN environment including LUN masking and mapping;
determining zoning based upon the storage; and
triggering events for the simulated SAN environment comprising:
reading configuration properties file;
obtaining common object manager (COM) details from the configuration properties file;
obtaining events from an indication configuration file:
accessing COM using the COM details:
obtaining switch object details and invoking a trigger modify event if there is a switch event; and
obtaining array object details and executing a trigger add/delete event if there is an array event.

15. The method of claim 1, rendering the simulated SAN environment on a graphical user interface (GUI) on the computer.

* * * * *